United States Patent [19]
Frei et al.

[11] Patent Number: 5,341,115
[45] Date of Patent: Aug. 23, 1994

[54] REINFORCED WRAP AROUND GROUND AND METHOD

[75] Inventors: John K. Frei, Mesa; Howard D. Knuth, Tempe, both of Ariz.

[73] Assignee: Motorola, Inc., Schaumburg, Ill.

[21] Appl. No.: 993,102

[22] Filed: Dec. 14, 1992

[51] Int. Cl.[5] .............................................. H01D 3/08
[52] U.S. Cl. .................................. 333/246; 333/238; 29/854; 29/875; 29/880
[58] Field of Search ....................... 333/246, 247, 238; 29/854–855, 856, 875–880

[56] References Cited

U.S. PATENT DOCUMENTS

| | | | |
|---|---|---|---|
| 3,885,847 | 5/1975 | Thibeault. | |
| 4,529,836 | 7/1985 | Powers et al. | 174/94 R |
| 4,610,032 | 9/1986 | Miller et al. | 455/325 |
| 4,642,592 | 2/1987 | Beeck | 333/246 |
| 4,670,723 | 6/1987 | Roland et al. | 333/81 |

Primary Examiner—Robert J. Pascal
Assistant Examiner—Darius Gambino
Attorney, Agent, or Firm—Jeffrey D. Nehr

[57] ABSTRACT

A reinforced wrap around ground and method includes a substrate, including opposite first and second substrate surfaces separated by a substrate edge. A first metalization layer is coupled to the first substrate surface and a second metalization layer comprising an electrical ground, is coupled to the second substrate surface. An electrical ground reinforcement is coupled between the first metalization layer and the second metalization layer around the substrate edge. Conductive paste coats the electrical ground reinforcement, and the conductive paste is fired to bind the wrap around ground to the substrate and to electrically ground the first metalization layer to the second metalization layer through the electrical ground reinforcement and the conductive coating.

8 Claims, 2 Drawing Sheets

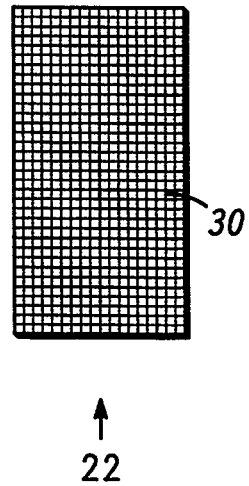
22
FIG. 3
FIG. 4
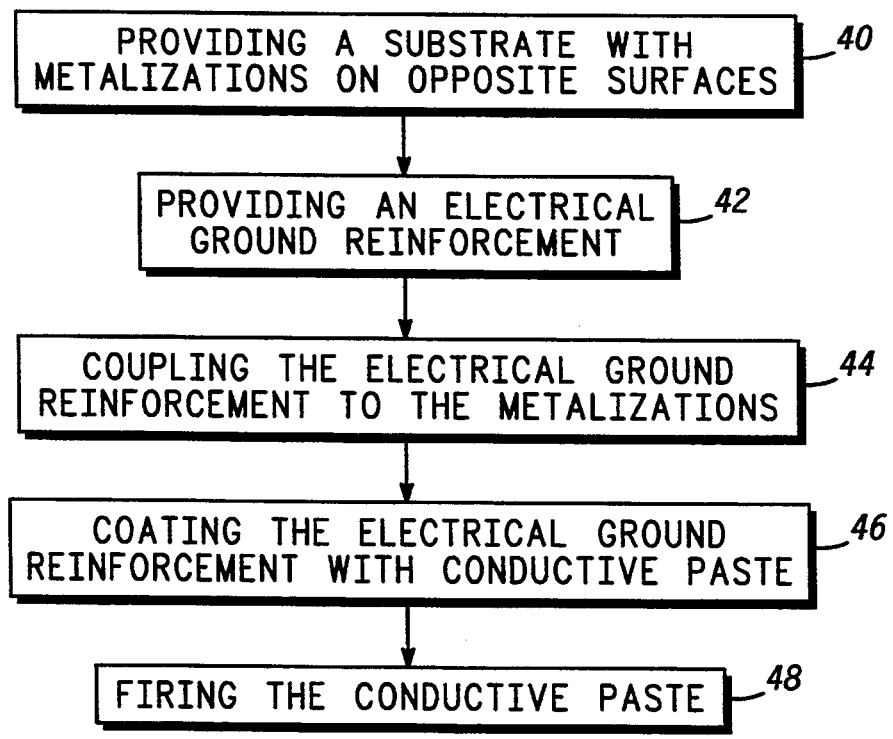

REINFORCED WRAP AROUND GROUND AND METHOD

FIELD OF THE INVENTION

This invention relates in general to electrical grounding and in particular to attachment of microwave circuits to a ground plane.

BACKGROUND OF THE INVENTION

In microwave circuits, attachment of components or circuitry to the ground plane is very critical to electrical performance of the associated device. Such attachment is typically accomplished by plated through holes or wrap around ground connections.

Plated through holes have the disadvantage of having to be placed in a particular area of the substrate. The particular location for the hole is not always known, however, and it is difficult to change the location of the plated through hole late in the process because the holes are punched in the "green state". If a plated through hole is required after the ceramic is fired, the change is effected by drilling or laser action, which can crack the ceramic substrate.

Wrap around grounds can be applied after firing the ceramic substrate and can be moved and applied at various locations around the periphery of the substrate. Traditional wrap around grounds use a conductive paste, such as silver, to make connection from the top metalization to the ground plane on the bottom surface. Once a wrap around ground is placed on the ceramic the bottom surface of the ceramic is no longer flat or planar. This lack of planarity prohibits subsequent screen printing operations and other process steps which require the substrate to be flat. In such cases, the wrap around ground must be placed on the substrate after all such process steps have been performed.

The silver paste comprising the wrap around ground thus may need to be fired at relatively low temperature (e.g., below the firing temperature of screen printed components such as resistors so as not to change their resistance value or cause oxidation). As the firing temperature of silver paste is lowered, the paste is increasingly subject to cracking and lower adhesion. The paste is particularly vulnerable to cracking and flaking at the edges of the substrate. The paste or wrap is also easily damaged by subsequent handling. The silver paste cannot be matched to the thermal coefficient of expansion of the ceramic and can crack simply due to repeated temperature cycles.

Additional wrap around ground techniques include clips. Clips, however, have the disadvantage of expense and thickness greater than 0.0254 millimeters (0.001 inches). In addition, clips are not comprised of silver (leading to galvanic action with silver metalizations), and must be preformed.

Thus, what is needed is a reinforced wrap around ground and method which provides for strong adhesion to both the circuitry to be grounded and the ground plane. The adhesion of the wrap around ground should not depend on the properties of conductive paste. The wrap around ground should not be susceptible to cracking or peeling, even from differences in the thermal coefficient of expansion between the paste and the ceramic substrate. The electrical performance of the wrap around ground should not degrade even if the fired conductive paste cracks. Finally, the wrap should not be susceptible to handling damage and should fit in the same space as a conventional wrap around ground.

SUMMARY OF THE INVENTION

Accordingly, it is an advantage of the present invention to provide a new and improved apparatus for reinforced wrap around ground which is stronger than conventional wrap around grounds made with conductive paste. It is a further advantage of the present invention that the wrap around ground has a strength which is independent of the adhesion of the paste and is not dependent on the surface properties of the upper and lower metalizations. It is still a further advantage of the present invention that the current-carrying capability of the wrap is not dependent on the thickness of the paste at any corners in the wrap around. It is yet a further advantage that the resistivity of the paste is not critical to electrical performance, and that the planarity of the bottom surface of the device using the wrap be substantially the same as for a conventional wrap.

To achieve these advantages, a reinforced wrap around ground is contemplated which includes a substrate, including opposite first and second substrate surfaces separated by a substrate edge. A first metalization layer is coupled to the first substrate surface and a second metalization layer comprising an electrical ground, is coupled to the second substrate surface. An electrical ground reinforcement is coupled between the first metalization layer and the second metalization layer around the substrate edge. A conductive coating surrounds the electrical ground reinforcement, such that the electrical ground reinforcement is bound to the substrate edge and the first metalization layer is electrically grounded to the second metalization layer through the electrical ground reinforcement and the conductive coating.

To further achieve these advantages, a method for making a reinforced wrap around ground is contemplated which includes providing a substrate including a first metalization on a first substrate surface and a second metalization on a second substrate surface, with the first and second substrate surfaces opposite each other and separated by a substrate edge. An electrical ground reinforcement is also provided. The electrical ground reinforcement is coupled to the first metalization and to the second metalization around the substrate edge. The electrical ground reinforcement is coated with conductive paste, which is fired to produce a coated reinforced electrical ground connection between the first metalization and the second metalization which is bound to the substrate edge.

The above and other features and advantages of the present invention will be better understood from the following detailed description taken in conjunction with the accompanying drawings.

BRIEF DESCRIPTION OF THE DRAWINGS

In FIG. 3, there is shown an enlarged view of the conductive mesh used to reinforce the wrap around ground shown in FIGS. 1 and 2.

In FIG. 4, there is shown a flowchart of steps in a method of making the reinforced wrap around ground shown in FIGS. 1 and 2.

DETAILED DESCRIPTION OF THE PREFERRED EMBODIMENT

Figure 1:
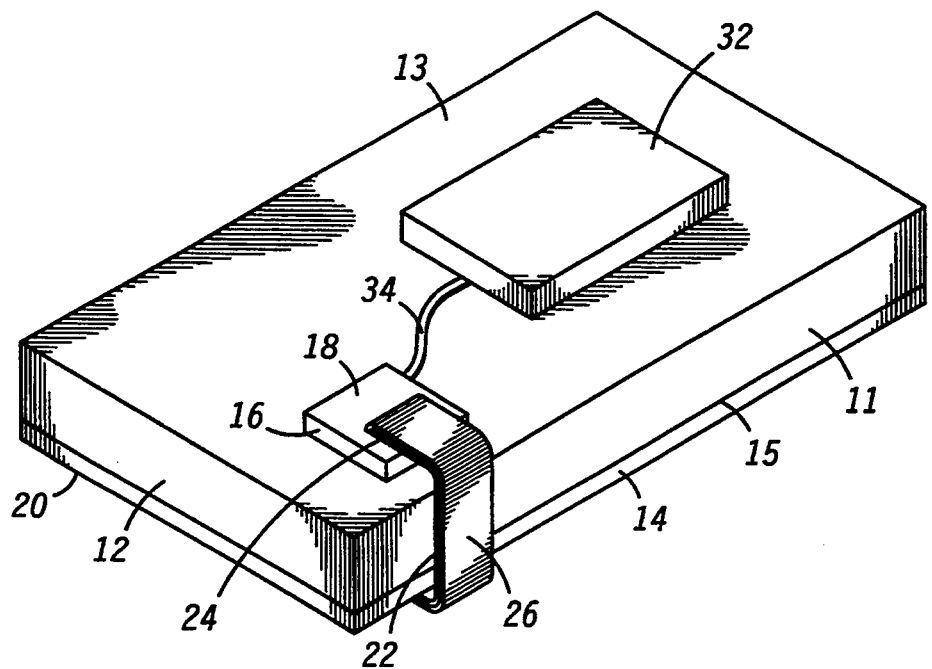
In FIG. 1, there is shown an enlarged oblique view of a reinforced wrap around ground in accordance with a preferred embodiment of the invention.

In FIG. 1, there is shown an oblique view of a reinforced wrap around ground in accordance with a preferred embodiment of the invention. Substrate 12, which can be comprised of ceramic, has upper surface 13 and lower surface 15. Lower surface 15 is positioned immediately adjacent to bottom metalization 14. On the upper surface 13 of substrate 12 is top metalization 16. Both bottom metalization 14 and top metalization 16 in the preferred embodiment are comprised of silver. The top metalization 16 is electrically coupled through connection 34 to microwave circuitry 32 on the upper surface 13 of substrate 12. Bottom metalization 14 represents a ground plane for the microwave circuitry 32.

Electrical grounding of the microwave circuitry 32 is achieved through top metalization 16, connection 34 and conductive mesh 22. Conductive mesh 22 electrically couples the bottom surface 20 of the bottom metalization 14 to the top surface 18 of top metalization 16. The conductive mesh 22 is physically attached at one end to the bottom surface 20 of the bottom metalization 14 and at the other end to the top surface 18 of top metalization 16 by welding, such as conventional resistance welding (DC spot welding), at weld points 24. The conductive mesh 22 in the preferred embodiment is comprised of silver, and is on the order of 0.635 millimeters (0.025 inches) in both length and width (a 1:1 aspect ratio is a typical design rule for a good electrical ground connection). The use of silver for the conductive mesh 22 as well as the bottom metalization 14 and the top metalization 16 eliminates any potential for galvanic action between dissimilar metals, such as would occur if the conductive mesh 22 were to comprise copper or other conductive material. Conductive mesh 22 is shown covered by conductive paste 26, which has been fired. The conductive paste 26 in the preferred embodiment also comprises silver. The conductive paste 26 is available as commercial, off-the-shelf thick film, screen printable conductive paste.

Figure 2:
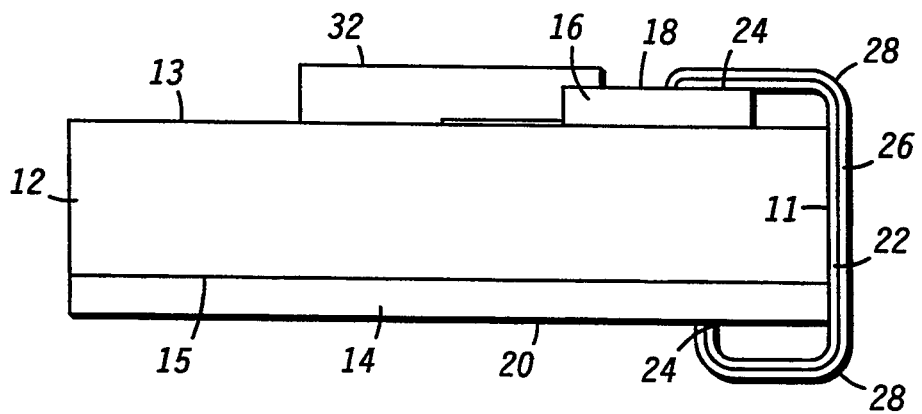
In FIG. 2, there is shown an enlarged end view of the reinforced wrap around ground in FIG. 1.

FIG. 2 illustrates the reinforced wrap around ground shown in FIG. 1 in an end view. The reference numerals in FIG. 2 correspond to elements which are identical in structure and function to their counterparts in FIG. 1, and are described above. FIG. 2 also more clearly illustrates conductive mesh 22 connecting the bottom surface 20 of the bottom metalization 14 to the top surface 18 of top metalization 16 at the weld points 24. In addition, FIG. 2 more clearly shows conductive paste 26 covering conductive mesh 22.

The conductive paste 26 shown in FIG. 2 covers and encapsulates the conductive mesh 22, contacting the substrate edge 11 through the mesh openings 30 (see FIG. 3). The conductive paste 26 is placed over the conductive mesh 22 to a variable thickness on the order of 0.0127 millimeters (0.0005 inches) to 0.0381 millimeters (0.0015 inches), as shown in the enlarged view in FIG. 2. Rather large variability occurs in the thickness of the conductive paste 26 when the conductive paste 26 is applied manually. When fired, the conductive paste 26 binds the conductive mesh 22 to the substrate edge 11 and to the top and bottom metalizations (14 and 16).

Corner areas 28 of the conductive paste 26 covering conductive mesh 22 are shown in FIG. 2. In traditional wrap around grounds, conductive paste 26 alone is used to couple the bottom surface 20 of the bottom metalization 14 to the top surface 18 of top metalization 16. In such traditional wrap around grounds corner areas 28 of conductive paste 26 may contain a thinner layer of conductive paste 26 than other portions of the wrap around ground connection. It is very difficult to obtain uniform thickness of conductive paste 26 at the corner areas 28. This thinning phenomena results in traditional conductive paste wrap around grounds being susceptible to cracking and lifting and thus poor electrical grounding between the top metalization 16 and the bottom metalization 14.

Conductive paste 26 also needs to be fired at a temperature below any critical temperature of components of microwave circuitry 32 shown in FIGS. 1 and 2, since the firing of conductive paste 26 is typically performed after the microwave circuitry 32 is placed on upper surface 13 of substrate 12. The low temperature firing of the reinforced wrap around ground contemplated here occurs at a temperature of approximately 400 to 500 degrees Celsius, compared with standard conductive paste firing at approximately 800 degrees Celsius.

In conventional, non-reinforced wrap around grounds, the need for low temperature fired conductive paste 26 exacerbates the problems of cracking and lower adhesion. The conductive paste 26 is particularly vulnerable to cracking and flaking at the edges of the substrate 12. A non-reinforced conductive paste wrap is very easily damaged by subsequent handling. The non-reinforced silver paste wrap cannot be matched to the thermal coefficient of expansion of the ceramic and can crack simply due to repeated temperature cycles.

However, in the present case, the use of conductive mesh 22 welded to the bottom surface 20 of the bottom metalization 14 and to the top surface 18 of top metalization 16 to reinforce the wrap around ground adds a great deal of structural stability, preventing cracking and poor adhesion of the wrap around ground.

FIG. 3 shows a side view of the conductive mesh 22. Conductive mesh can be comprised of solid silver, which can be sufficiently flexible and workable to be deformed into the proper shape to lie adjacent to the substrate edge 11 and to form the wrap around ground. In the preferred embodiment, the conductive mesh is comprised of substantially square mesh elements 30, of approximately 0.0254 millimeters (0.001 inches) on a side. Other mesh sizes can be used, depending on the application.

FIG. 4 illustrates a flowchart of steps in making the reinforced wrap around ground shown in FIGS. 1–3. The reference numerals in the following description refer to the elements shown in FIGS. 1–3, with the reference numerals referring to boxes in FIG. 4 corresponding to the steps illustrated in FIG. 4.

In FIG. 4, box 40 illustrates providing a substrate 12 with first and second metalizations (14 and 16) on opposite surfaces (13 and 15) of the substrate 12. Box 42 illustrates providing an electrical ground reinforcement, which can be comprised of conductive mesh 22. The conductive mesh 22 can be approximately 0.0254 millimeter (0.001 inch) silver mesh. Box 44 illustrates the step of coupling the electrical ground reinforcement to the first and second metalizations (14 and 16). Such coupling can be accomplished by welding. Box 46 illustrates the step of coating the electrical ground reinforcement with conductive paste 26. The step of firing the conductive paste 26 is shown in box 48. The result of the steps shown in FIG. 4 is a reinforced wrap around ground which adheres to the top and bottom metalizations (14 and 16) and to the substrate edge 11.

Thus, a reinforced wrap around ground and method has been described which overcomes specific problems and accomplishes certain advantages relative to prior art methods and mechanisms. The improvements over known technology are significant. The reinforced wrap around ground, although slightly more expensive to produce than non-reinforced wrap around grounds because of additional material, time, and manufacturing steps, is much less susceptible to cracking and flaking, remains strong through thermal cycling, and does not damage easily from handling. The reinforced wrap around ground is independent of the adhesion of the conductive paste used to coat the reinforcement. The current carrying capability of the wrap is not dependent on the thickness of the conductive paste at a corner of the wrap around ground since the current can flow through the conductive mesh (wire), not just conductive paste. The reinforced wrap around ground is generally suitable for any applications requiring wrap around grounds and fits in the same space as a conventional wrap around ground. The reinforced wrap around ground is essential for high reliability applications such as flight and space hardware. The resistivity of the paste is not critical to the electrical performance of the microwave circuitry (or other circuitry) using the reinforced wrap around ground. Finally, the planarity of the bottom surface of the circuitry substrate is about the same as when using conventional wraps since the reinforcement mesh used can be of relatively small dimension compared with the substrate and circuitry size (e.g., only 0.0254 millimeters (0.001 inches) thick).

Thus, there has also been provided, in accordance with an embodiment of the invention, a reinforced wrap around ground and method that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A reinforced wrap around electrical ground comprising:
   a substrate, including opposite first and second substrate surfaces separated by a substrate edge;
   a first metalization layer coupled to the first substrate surface;
   a second metalization layer comprising an electrical ground, wherein the second metalization layer is coupled to the second substrate surface;
   electrical around reinforcement means coupled between the first metalization layer and the second metalization layer around the substrate edge, wherein the electrical ground reinforcement means comprises conductive mesh welded to the first metalization layer and to the second metalization layer; and
   a conductive coating applied to the electrical ground reinforcement means, such that the electrical ground reinforcement is bound to the substrate edge and the first metalization layer is electrically grounded to the second metalization layer through the electrical ground reinforcement means and the conductive coating.

2. A method for making a reinforced wrap around electrical ground comprising the steps of:
   providing a substrate including a first metalization layer on a first substrate surface and a second metalization layer on a second substrate surface, the first and second substrate surfaces opposite each other and separated by a substrate edge;
   providing an electrical ground reinforcement;
   coupling the electrical ground reinforcement to the first metalization layer and to the second metalization layer around the substrate edge;
   coating the electrical ground reinforcement with conductive paste; and
   firing the conductive paste to bind the reinforced electrical ground connection to the substrate edge and to produce a coated reinforced electrical ground connection between the first metalization and the second metalization.

3. A method as claimed in claim 2, wherein the step of providing a substrate comprises the step of providing a substrate of ceramic with substantially parallel first and second substrate surfaces.

4. A method as claimed in claim 2, wherein the step of providing a substrate comprises the step of providing first and second metalization layers comprised of silver.

5. A method as claimed in claim 2, wherein the step of providing an electrical ground reinforcement comprises the step of providing a conductive mesh.

6. A method as claimed in claim 2, wherein the step of coupling comprises the step of welding the electrical ground reinforcement to the first metalization layer and to the second metalization layer.

7. A method as claimed in claim 2, wherein the step of coating comprises the step of coating the electrical ground reinforcement with conductive paste comprised of silver.

8. A microwave circuit wrap around electrical ground comprising:
   a substrate, including opposite first and second substrate surfaces separated by a substrate edge;
   a first metalization layer coupled to the first substrate surface;
   a second metalization layer comprising an electrical ground, wherein the second metalization layer is coupled to the second substrate surface;
   electrical ground reinforcement means coupled between the first metalization layer and the second metalization layer wrapping around the substrate edge, wherein the electrical ground reinforcement means comprises conductive mesh welded to the first metalization layer and to the second metalization layer; and
   a conductive coating applied to the electrical ground reinforcement means, such that the electrical ground reinforcement means is bound to the substrate edge and the first metalization layer is electrically grounded to the second metalization layer comprising the electrical ground through the electrical ground reinforcement means and the conductive coating.

* * * * *